United States Patent
Hishinuma

(10) Patent No.: US 6,171,915 B1
(45) Date of Patent: *Jan. 9, 2001

(54) METHOD OF FABRICATING A MOS-TYPE TRANSISTOR

(75) Inventor: Kuniyuki Hishinuma, Tochigi-ken (JP)

(73) Assignee: Nippon Precision Circuits Inc., Tokyo (JP)

( * ) Notice: This patent issued on a continued prosecution application filed under 37 CFR 1.53(d), and is subject to the twenty year patent term provisions of 35 U.S.C. 154(a)(2).

Under 35 U.S.C. 154(b), the term of this patent shall be extended for 0 days.

(21) Appl. No.: 08/661,574

(22) Filed: Jun. 11, 1996

(30) Foreign Application Priority Data

Jun. 13, 1995 (JP) .................................................. 7-146368

(51) Int. Cl.[7] ................................................. H01L 21/336
(52) U.S. Cl. ............................ 438/303; 438/305; 438/595
(58) Field of Search ..................................... 438/299, 230, 438/231, 303, 305, 306, 585, 595, FOR 193, FOR 204, FOR 177

(56) References Cited

U.S. PATENT DOCUMENTS

| | | | |
|---|---|---|---|
| 4,429,011 | * | 1/1984 | Kim et al. . |
| 4,471,004 | * | 9/1984 | Kim . |
| 4,849,377 | * | 7/1989 | Kim et al. . |
| 5,476,802 | * | 12/1995 | Yamazaki et al. . |

* cited by examiner

Primary Examiner—Mary Wilczewski
(74) Attorney, Agent, or Firm—Jordan and Hamburg LLP

(57) ABSTRACT

To provide a method of fabricating a MOS-type transistor of a LDD structure with a gate electrode made of molybdenum, which brings about a reduction in the amount of overlapping between the gate electrode and source/drain, a gate electrode is made of molybdenum and forms a first pattern. The first pattern is subject to nitriding process to form a second pattern. The second pattern includes an interior electrode layer and a nitride layer located outside of the electrode layer. The thickness of the nitride layer corresponds to the amount of overlapping between the second pattern and source/drain.

7 Claims, 3 Drawing Sheets

METHOD OF FABRICATING A MOS-TYPE TRANSISTOR

BACKGROUND

The present invention relates to a method of fabricating a MOS-type transistor having a LDD (Lightly Doped Drain and Source) structure and more particularly, to a method of fabricating a MOS-type transistor which has a gate electrode made of molybdenum.

FIG. 3 shows the structure of a conventional MOS-type transistor. This transistor is of a LDD structure and has a gate electrode made of molybdenum. 11 denotes a silicon substrate. 12 is a gate insulating layer. 13 is a gate electrode made of molybdenum. 14a and 14b are a low density diffusion layer and a high density diffusion layer, respectively and serve as a source/drain. 15 are side wall spacers.

In the prior art, the gate electrode 13 and the low density diffusion layer 14a (source/drain) overlap each other as shown in FIG. 3. This prevents high speed operation as the elements become complicated. Where the gate electrode is made of polysilicon, the polysilicon layer is oxidized under heat to form an oxidized layer around the gate electrode. The thickness of this oxidized layer may be adjusted so as to reduce the amount of overlapping. Molybdenum is however subject to sublimation during heat oxidation. It is quite difficult to form such an oxidized layer and thus, control the amount of overlapping between the gate electrode and source/drain in the event that the gate electrode is made of molybdenum.

It is an object of the present invention to provide a method of fabricating a MOS-type transistor having a LDD structure and including a gate electrode made of molybdenum, which can reduce the amount of overlapping between the gate electrode and source/drain.

SUMMARY

The present invention provides a method of fabricating a MOS-type transistor which comprises the steps of forming a first pattern including a gate electrode made of molybdenum, subjecting the first pattern to nitriding process so as to form a second pattern composed of an interior electrode layer and a nitride layer outside of the electrode layer, whereby the nitride layer has a thickness corresponding to the amount of overlapping between the second pattern and source/drain.

DETAILED DESCRIPTION OF THE INVENTION

FIGS. 1A to 1D are views showing a sequence of fabrication steps in a first embodiment.

Figure 1A:
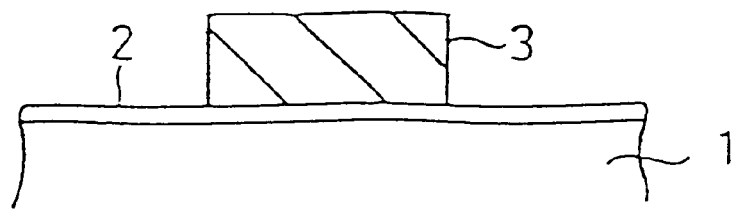
FIGS. 1A to 1D illustrate a sequence of fabrication steps in a first embodiment.
Figure 1B:
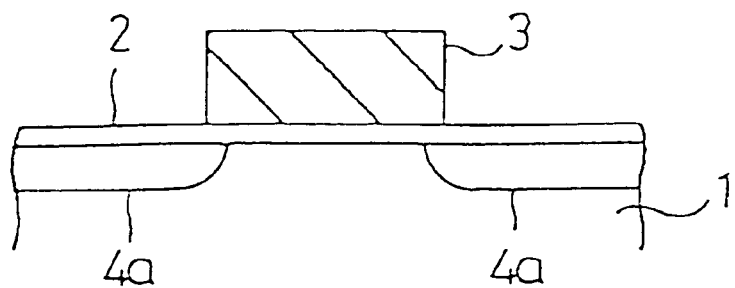
Figure 1C:
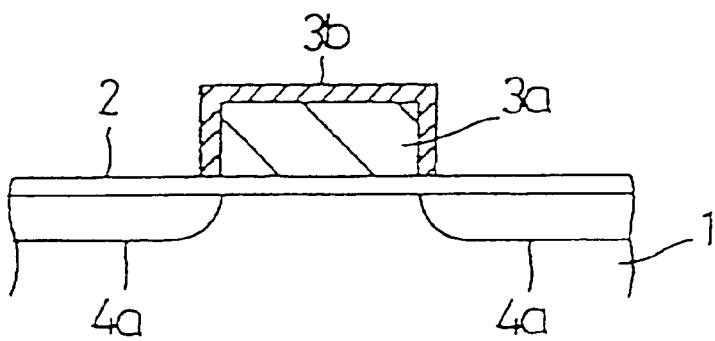
Figure 1D:
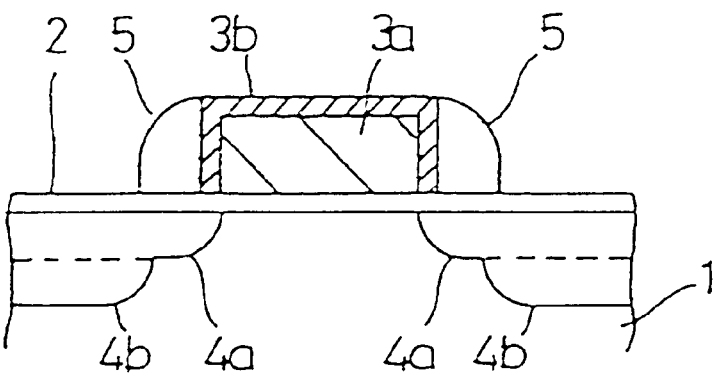
Figure 2A:
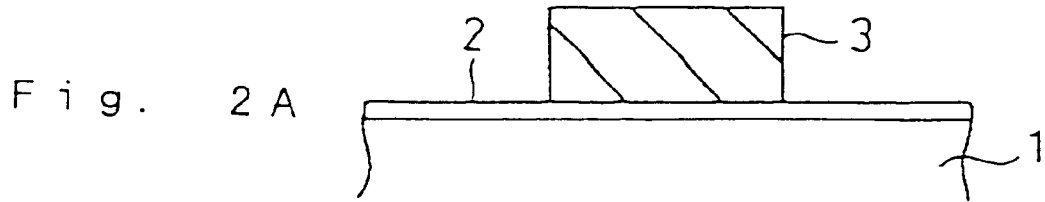
FIGS. 2A to 2D illustrate a sequence of fabrication steps in a second embodiment.
Figure 2B:
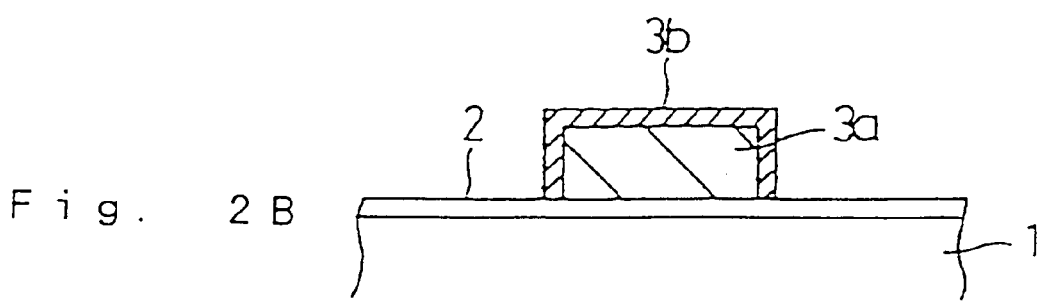
Figure 2C:
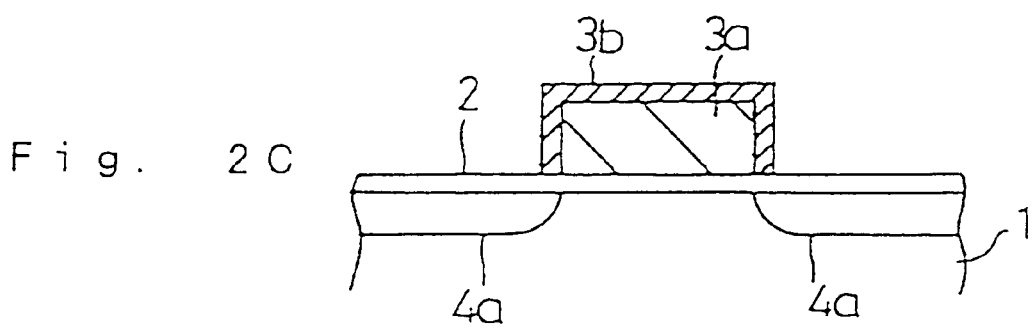
Figure 2D:
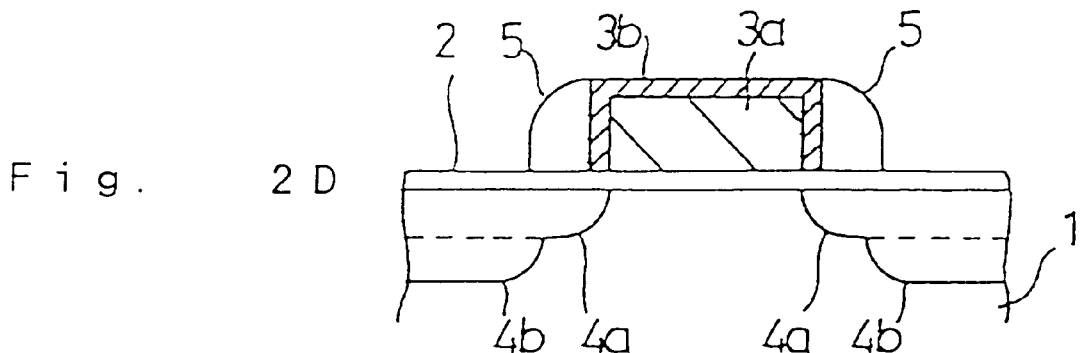
Figure 3:
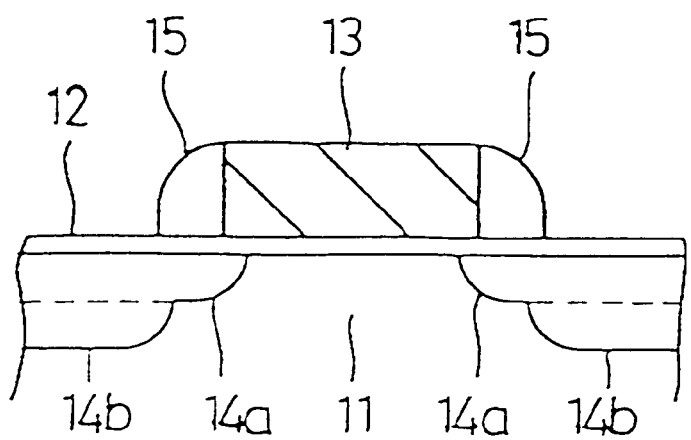
FIG. 3 illustrates a conventional method.

FIG. 1A, a gate insulating layer 2 is formed on a silicon substrate 1. A molybdenum pattern 3 is placed on the gate insulating layer 2 and has a shape corresponding to the gate electrode.

FIG. B, with the molybdenum pattern 3 as a mask, an impurity or ion is implanted so as to form a low density diffusion layer 4a.

FIG. C, the pattern is subject to nitriding process in a mixture of ammonia gas and hydrogen (or forming) gas at a temperature of approximately 700° C. so as to form an interior electrode layer 3a and a nitride layer 3b located externally of the electrode layer 3a. The temperature and time of the nitriding process is adjusted so that the thickness of the nitride layer 3b corresponds to the amount of overlapping between the pattern composed of the electrode layer 3a (essentially as a gate electrode) and the nitride layer 3b and the low density diffusion layer 4a (specifically, source/drain of the MOS-type transistor in final form).

FIG. D, after the side wall spacers 5 have been formed, an impurity ion is implanted to form a high density diffusion layer 4b while the pattern, the electrode layer 3a and the nitride layer 3b, and the side wall spacers 5 are serving as masks. Thereafter, the low density diffusion layer 4a and the high density diffusion layer 4b are activated to complete a MOS-type transistor of a LDD structure.

FIGS. 2A to 2D illustrate a sequence of fabrication steps in a second embodiment. Reference will now be made to the second embodiment. Like parts are given like reference numerals used in FIG. 1. As compared to the embodiment shown in FIGS. 1A to 1D, it will be understood that in the second embodiment shown in FIGS. 2A to 2D, a molybdenum pattern, which is composed of the electrode layer 3a and the nitride layer 3b, is formed before the low density diffusion layer 4a is formed. With this pattern as a mask, impurity ion is injected so as to form a low density diffusion layer 4a. The other fabrication steps are substantially identical to those of the first embodiment.

According to the present invention, a gate electrode is made of molybdenum and forms a first pattern. The first pattern is subject to a nitriding process so as to form a second pattern. The second pattern is composed of an electrode layer made of molybdenum, and a nitride layer located externally of the electrode layer. The thickness of the nitride layer corresponds to the amount of overlapping between the second pattern and source/drain. It is thus possible to reduce the amount of overlapping between the gate electrode and the source/drain.

What is claimed is:

1. A method of fabricating a MOS-type transistor of a LDD (Lightly Doped Drain and Source) structure comprising the steps of:

forming a first pattern, said first pattern including a gate electrode made of molybdenum;

subjecting the first pattern to a nitriding process so as to form a second pattern, said second pattern being composed of an interior electrode layer and a nitride layer outside of the electrode layer;

subjecting said second pattern to an implanting process self-aligned to the second pattern in which impurities are implanted;

annealing to diffuse the implanted impurities to form source and drain regions; and said step of subjecting the first pattern to the nitriding process and said step of annealing including controlling the nitriding process such that the nitride layer created by the nitriding process has a thickness at a side of said gate electrode which is approximately equal to an amount of overlapping between the second pattern and said source and drain regions by diffusion of said implanted impurities in said annealing process.

2. A method of fabricating a MOS-type transistor, comprising the steps of:

forming an insulating layer on a substrate;

forming a molybdenum pattern on said insulating layer;

implanting an impurity ion to form a low density diffusion layer using said molybdenum pattern as a mask;

subjecting said molybdenum pattern to a nitriding process to form an interior electrode layer and a nitride layer external of said interior electrode layer; and controlling said nitriding process in a manner resulting in formation of a thickness of said nitride layer at a side of said molybdenum pattern which is approximately equal to an amount of overlapping between said molybdenum pattern and said low density diffusion layer.

3. A method according to claim 2, further comprising:

forming side wall spacers adjacent said molybdenum pattern; and implanting an impurity ion to form a high density diffusion layer using a combination of said molybdenum pattern and said side wall spacers as a mask.

4. A method according to claim 2, wherein said nitriding process includes exposing said molybdenum pattern to a mixture of ammonia gas and hydrogen gas at a temperature of approximately 700° C.

5. A method according to claim 2, wherein said step of controlling includes adjusting at least one of a temperature and a time of said nitriding process.

6. A method according to claim 2, wherein said interior electrode layer of said molybdenum pattern corresponds to a gate electrode, and said low density diffusion layer corresponds to a source/drain.

7. A method according to claim 2, wherein said steps of subjecting and controlling are performed prior to said step of implanting.

* * * * *